United States Patent [19]
Yu et al.

[11] Patent Number: 5,747,380
[45] Date of Patent: May 5, 1998

[54] ROBUST END-POINT DETECTION FOR CONTACT AND VIA ETCHING

[75] Inventors: Chen-Hua Yu; Syun-Ming Jang, both of Hsin-Chu, Taiwan

[73] Assignee: Taiwan Semiconductor Manufacturing Company, Ltd., Hsin-Chu, Taiwan

[21] Appl. No.: 606,833

[22] Filed: Feb. 26, 1996

[51] Int. Cl.$^6$ .................................................. H01L 21/44
[52] U.S. Cl. ........................................ 438/599; 438/926
[58] Field of Search ................................. 437/195, 191, 437/8, 186, 228, 235, 245, 225; 438/599, 637, 926, 942

[56] References Cited

U.S. PATENT DOCUMENTS

| | | | |
|---|---|---|---|
| 5,036,015 | 7/1991 | Sandhu et al. | 437/8 |
| 5,081,421 | 1/1992 | Miller et al. | 324/671 |
| 5,081,796 | 1/1992 | Schultz | 51/165.74 |
| 5,265,378 | 11/1993 | Rostoker . | |
| 5,278,105 | 1/1994 | Eden et al. | 437/250 |
| 5,292,689 | 3/1994 | Cronin et al. | 437/228 |
| 5,323,049 | 6/1994 | Montonami | 257/401 |
| 5,332,467 | 7/1994 | Sune et al. | 156/636 |
| 5,341,310 | 8/1994 | Gould et al. . | |
| 5,356,513 | 10/1994 | Burke et al. | 156/636 |
| 5,459,093 | 10/1995 | Kuroda et al. | 437/51 |
| 5,494,853 | 2/1996 | Lur | 437/195 |

FOREIGN PATENT DOCUMENTS 6-053249  2/1994  Japan .

OTHER PUBLICATIONS

S. Wolf et al. "Silicon Processing for the VLSI Era vol. I" pp. 171–172 Lattice Press, Calif. (1986).
S. Wolf, "Silicon Processing for the VLSI Era–vol. II", Lattice Press, Sunset Beach, CA, p. 328.

*Primary Examiner*—Jey Tsai
*Assistant Examiner*—Caridad Everhart
*Attorney, Agent, or Firm*—George O. Saile; Stephen B. Ackerman

[57] ABSTRACT

A method for improving the end-point detection for contact and via etching is disclosed. The disclosure describes the deliberate addition of dummy patterns in the form of contact and via holes to the regular functional holes in order to increase the amount of etchable surface area. It is shown that, one can then take advantage of the marked change in the composition of the etchant gas species that occurs as soon as what was once a large exposed area has now been consumed through the etching process. This then gives a strong and robust signal for the end of the etching process. This in turn results in better controlled and more reliable product. It is also indicated that with the full uniform pattern of the via layers now possible, the chemical/mechanical polishing process becomes much less pattern sensitive.

24 Claims, 2 Drawing Sheets

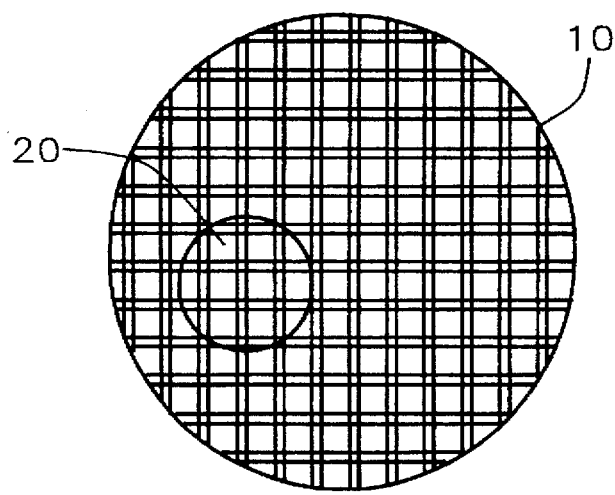
FIG. 1 – Prior Art
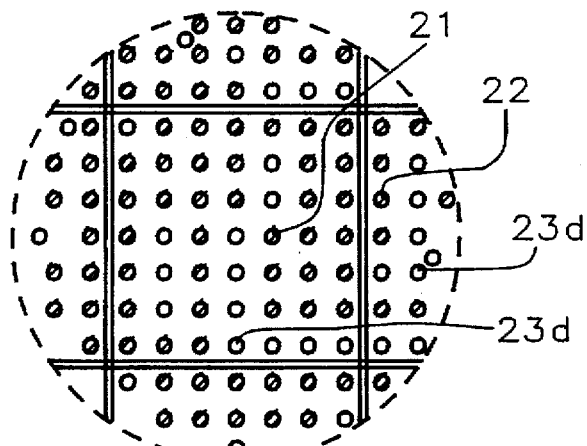
FIG. 2
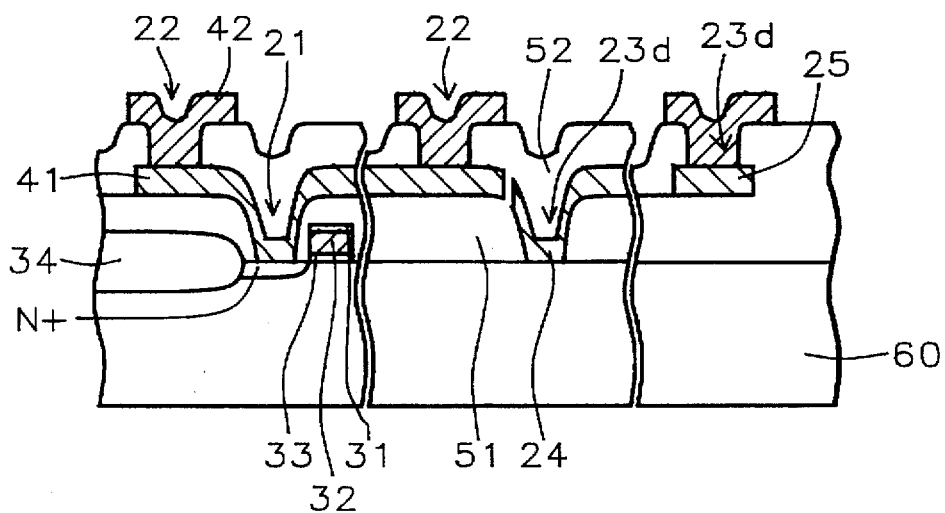
FIG. 3

ROBUST END-POINT DETECTION FOR CONTACT AND VIA ETCHING

BACKGROUND OF THE INVENTION (1) Field of the Invention

The invention relates generally to semiconductors, and more particularly, to a method for improving end-point detection for contact and via etching.

(2) Description of the Related Art

The building of a semiconductor structure involves processes where layer upon layer of different materials are built serially in accordance with precise specifications. Etching constitutes a very important part of the total process because each layer need to be shaped and personalized by some form of etching. In the manufacture of a single metal layer, an n-channel, polysilicon-gate metal-oxide-semiconductor, MOS, for example, there are 9 etching steps out of a total of 32, (see, S. Wolf, "Silicon Processing for the VLSI Era," Lattice Press, Sunset Beach, CA, Vol. II, p. 328). With the advent of multi-layer semiconductor manufacturing, where as many as 4 metal layers may be incorporated into one structure, the number of etching steps increases more dramatically.

Since etching involves defining shapes and patterns of regions through the removal of materials in precise amounts, precision control of when to start and stop, or end-point detection, becomes very important. The controls depend upon the nature of etching, i.e., whether "wet" or "dry." Wet etching is well established, because liquid etchant systems are available with very high selectivity to both substrate and the masking material used to define regions or patterns on a given layer. However, with the further miniaturization of integrated circuit features on semiconductors, it is becoming difficult, if not impossible to control the definition of patterns with wet etching. This is primarily due to the isotropic nature of wet etching. That is, if the thickness of the film layer being etched is comparable to the minimum lateral dimensions, roughly equal amounts of material removal in all directions causes undercutting in the vertical sidewalls of the pattern. This is not desirable. One alternative method that offers the capability of non-isotropic, or anisotropic etching is dry-etching. Dry etching also offers the important manufacturing advantage of eliminating the handling, consumption, and disposal of the relatively large quantities of dangerous acids and solvents used in wet etching and resist stripping processes.

There are a variety of dry etch processes. To name a few, there is the physical sputtering process in a vacuum environment of less than 100 millitor, then the reactive ion etch (RIE) in the 100 millitorr range, and a higher pressure process of plasma etching. Whether wet or dry, it is necessary to end the etching action once the end of an etch cycle is reached. One technique is to use the etch time as a measure of when the cycle is complete. However, this may not be an accurate measure, especially when there are many variables in the etch process. Instead, the end of the etching process may be determined by employing any one of the various "end-point detection" techniques used in the art. The four common methods for determining the endpoint of dry etch processes are laser interferometry and reflectivity, optical emission spectroscopy, direct observation of the etched surface through a viewing port on the chamber, by a human operator, and mass spectroscopy. It will be sufficient to mention these techniques by name only, and not describe them further here inasmuch as they are well known in the art. However, we will note that in each one of these techniques, the size of the continually changing area that is being etched plays a very important role in determining when to end the etching action.

Dry etching may be used to etch various types of thin films that are found in different layers of a semiconductor structure. The thin film may be, for example, an oxide layer, doped or undoped; silicon nitride; a polysilicon layer, doped or undoped; refractory metal silicides and polysilicides; a metal layer such as oxides, silicon nitride, polysilicon, a metal layer such as aluminum, titanium, tungsten, titanium nitride, various noble and near-noble of precious metals, as well as any combination of the foregoing or other metals. The structure of the layers may perform the function of interconnection lines, contact or via plugs, gates, word or bit lines, spacers, or insulation layers, among others. In addition to the layered structures on the semiconductor substrate, we also note, for completeness, the various active regions, such as diffusion regions that are formed within the substrate.

Prior art shows that specific methods have been devised to solve the problem of determining when to end the action of material removal, such as in chemical or micro-physical etching of a layer. Other methods have been advanced for material removal at the macroscopic level, such as in mechanical polishing.

In the former category, a simple method relies on monitoring the presence and then non-presence of scribe lines as a means for detecting the end of etching. The scribe lines are there on the wafer in the first place for the purpose of registering photolithographic masks with respect to a particular pattern on a layer. The lines are usually scribed in the kerf areas —which may also contain other product test sites—around the chip sites on the wafer. The lines are now used for a second purpose. After having instrumented the presence of the scribe lines at the beginning of an etch process, the "clear-out" or non-presence of the lines signals the end of the etch process. However, most often than not, the scribe lines get dark during the etching process, and consequently, the endpoint detection becomes blurred. Furthermore, the area of the scribe lines exposed to etching environment, such as plasma, are small and the change in the etchant gas composition during etch is not significant enough to reliably detect the end of etching. Therefore, an improved method must be found which is described later in this invention.

There are also methods proposed for end-point detection at the macro level of removing material, such as in chemical/mechanical polishing (CMP) of wafers surfaces, and of other surfaces to be planarized in the semiconductor structure. Usually, one difficulty in using CMP in planarizing semiconductor layers, for example, is determining when the material removal is complete. U.S. Pat. No. 5,036,015 describes a method to detect the planarization endpoint using the frictional difference between two materials. U.S. Pat. No. 5,081,421 describes the use of a capacitive measure of the dielectric thickness for insitu endpoint detection. U.S. Pat. No. 5,081,796 uses a laser interferometer for endpoint detection. Still another method is disclosed in U.S. Pat. No. 5,332,467 where a hard film is used to act as a polishing stop.

As seen above, prior art provides different end-point-detection solutions for different processes of material removal —chemical, physical, mechanical. In the case with chemical/physical etching process, scribe lines are used as described above. In mechanical polishing, electrical techniques as well as techniques exploiting the differences in material properties are employed to signal the time to stop the material removal. What is needed is a unified method for end-point-detection in general for all types of material removal in the form of etching and polishing of layers in a semiconductor structure, and for contact and via hole etching in particular.

The present invention discloses a general solution to the end point detection problem by addressing a phenomenon called the loading effect, which is encountered in the etching of semiconductor layers. First, a brief explanation of the phenomenon will be helpful in the understanding of the underlying problem. Loading effect is most commonly encountered in dry-etch processes and arises when the etch rate is dependent upon the etchable surface area exposed to the etchant. The area dependence comes about because the etch rate is generally proportional to the concentration of the etchant species which in turn are consumed by the etched area, among other sources. When the etch rate is also dependent upon the local pattern density, the effect is referred to as microlaoding. This is seen, for example, when a contact or via opening etch-back is performed. It follows then that the etch time depends on the amount of metal which is to remain on the substrate after the etch. If the desired features occupy a small fraction of the surface area of the substrate, a longer etch time will be required than if the features occupy a larger percentage of the surface area. Unless controlled carefully, well known manufacturing problems such as resist punch-through, unwanted notches in features can result from prolonged etch times. These problems could lead to device failures and/or reliability of the product. Additionally, the amount of metal on a layer also affects the deposition times of subsequent layers. This is because, the deposition rate is dependent upon the metal that is present on the wafer during the deposition process. The longer etch and deposition times can adversely affect the throughput times in the manufacturing line. Also, if different amounts of metal is to be removed for different products in a manufacturing line, different etch parameters must be utilized to process the different lots of products. The parameters may include gas flow rates, power, pressure, electrode gap distance, and etch time. The set of parameters used for an etch or deposition is referred to as a recipe. The requirement for the change of parameters from lot to lot reduces throughput as the etch or deposition recipe must be changed prior to the processing of a lot of wafers through the process.

SUMMARY OF THE INVENTION

To overcome the problems encountered in prior art as described above, it is proposed here to reduce the loading effect by increasing the area exposed to the etching environment. This is accomplished in two ways: a) by adding dummy polysilicon or metal patterns on a layer as appropriate, and b) by opening up dummy contact holes and via holes over the respective layers. The end result is an increase in the etchable area, and as will be seen in this disclosure, a sharpened change in gas composition will occur when the end point of etching is reached. Furthermore, as the etchable area in each lot is thus standardized by the addition of dummy regions, the loading effect from one lot to another is reduced. Additionally, the opening of contact and via holes over the metal, and combination thereof, can be adjusted at will to fine tune the parameters in the etching process. Finally, the dummy regions along with the active layers can be used effectively to provide an even surface for mechanical polishing.

It is therefore an object of this invention to improve the end-point detection during contact and via hole etching.

It is a further object of this invention to unify the etching recipes for product lots.

It is still another object of the invention to improve the end point detection for chemical/mechanical polishing (CMP) of wafers.

This object is achieved by providing a semiconductor wafer in which heavily doped regions extend relatively deeply into the silicon at locations where contacts are to be made. The gate structure and polysilicon local interconnect structures have also been patterned following prior art, except that there is now added dummy polysilicon regions in accordance with the present invention. A layer of inter-level oxide (typically, a thermal oxide or a CVD oxide/thermal oxide) covering the silicon wafer surface is also provided. The disclosed method continues with etching a plurality of contact holes in the dielectric oxide layer; however, many more than actually needed for electronic circuitry. The extra holes are the dummy holes, whose sole function is to provide a large and relatively uniformly patterned area of exposure to the etching environment. End point detection is now easier because the total area of the contacts being etched is comparable to other layers, and also the change in the composition of the etchant gas is abrupt when reaching the end of the etching process.

The objective is further met by providing a semiconductor on which there is formed a plurality of said contact holes and a first level metal which in turn is covered with the next level of inter-level dielectric. The disclosed method further continues with etching a plurality of via holes in the inter-level dielectric layer; however, many more than actually needed for electronic circuitry. The extra holes are the dummy holes, whose sole function is to provide a large and relatively uniformly patterned area of exposure to the etching environment.

The next objective of the present invention is accomplished by providing wafers of different devices in different lots in the production line. The pattern and the area of the contact holes and via holes that are to be etched at their respective layers are now made similar for all lots of wafers by using as many dummy holes as needed. It will be appreciated that since the lots of products now have similar amounts of etchable surface, the recipes, as defined earlier, for each lot will be similar.

The final objective is achieved by providing wafers containing a layer of contact holes including dummy contact holes, and layers of via holes containing dummy via holes. The layers are subjected to chemical/mechanical polishing at appropriate semiconductor manufacturing steps. It will be appreciated that the presence of large and uniformly distributed metal in the layers will facilitate the chemical/mechanical polishing.

BRIEF DESCRIPTION OF THE DRAWINGS

FIG. 1 shows a wafer of the prior art with scribe lines.

FIG. 2 shows a plan view according to the method of the present invention of a chip site with contact/via and dummy holes.

FIG. 3 shows a cross section of contact, via and dummy features, according to the method of the present invention.

DESCRIPTION OF THE PREFERRED EMBODIMENTS

Figure 4:
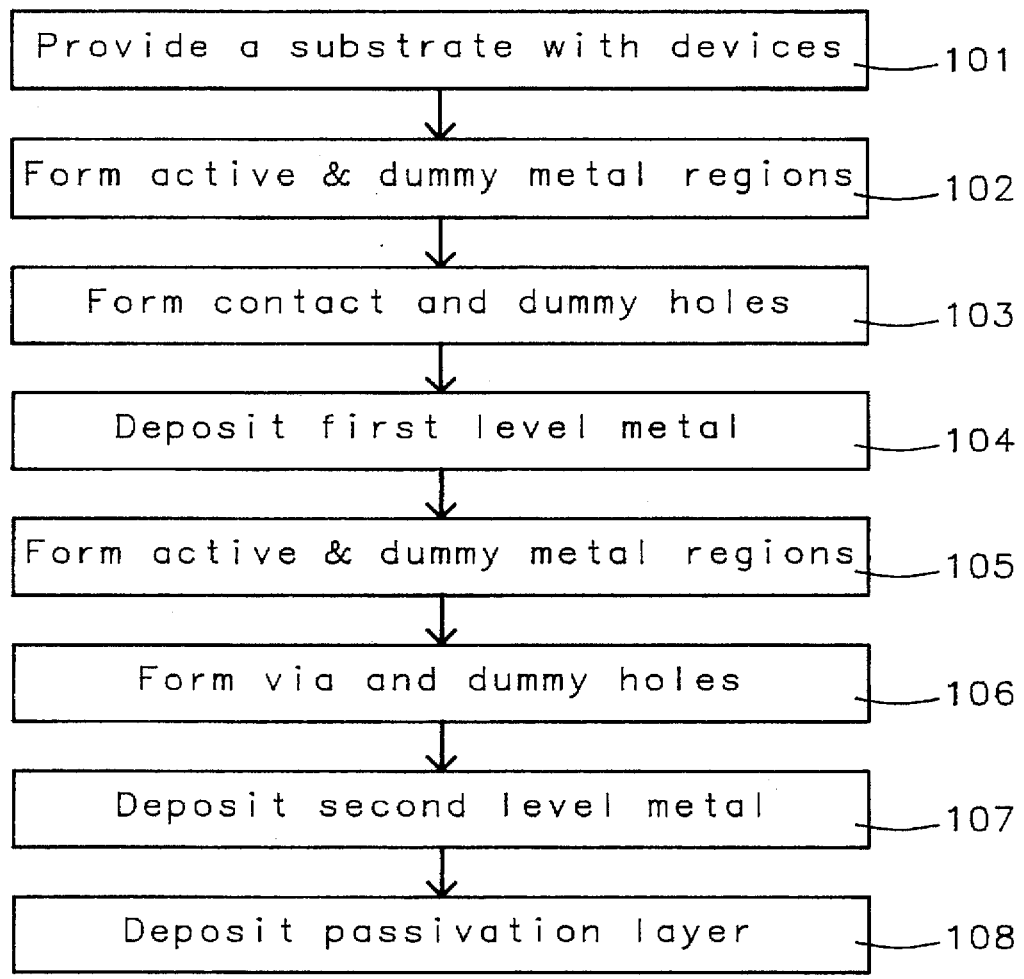
FIG. 4 shows a flow-chart for the process steps of the present invention.

Referring now to FIG. 1, a wafer is shown, along with scribe lines 10 and a region 20 of chip sites. These are formed by methods well known in the art and as they are not significant to the invention, will not be described in detail. An enlarged plan view of region 20 is shown in FIG. 2. FIG. 3 is a representative cross-section of region 20. Although a metal oxide semiconductor (MOS) device is depicted in regions 31, 32, 33 and 34, it will be understood by those familiar with the art that a bipolar device could also be used. Also, in what follows, well known materials or methods have not been described in detail in order to avoid unnecessarily obscuring the present invention.

As described below, dummy features are added to the various layers in order to increase the area exposed to etching. This in turn will result in providing a well defined end-point for etch stop. The dummy features are of particular shape, namely that of the existing hole patterns. The contact and via holes are shown as regions 21 and 22 in the plan view of FIG. 2. The extra holes that are etched either as dummy contact holes or as dummy via holes are shown in regions 23 in the same figure.

Now referring more specifically to FIG. 3, a dielectric layer 51, composed of, for example, silicon dioxide formed by plasma enhanced chemical vapor deposition (PECVD), is deposited to a thickness of between about 5,000 and 10,000 Angstroms. Contact openings or holes (21) are next patterned by lithographic means. Conventionally, a mask is used to define contact opening patterns in a photoresist film, and a dry-etch process is then used to open the contact windows through the CVD SiO$_2$ to the underlying polysilicon and the n$^+$regions in the silicon substrate 60. At this first critical step, the preferred embodiment is comprised of opening the maximum number of contact holes that can be patterned on the layer. Among them, the dummy holes are allowed to contact only the dummy regions below (24). As the etchant exposure area is maximized, therefore, by maximizing the number of holes, the end-point detection signal becomes more pronounced and more robust as provided by the abrupt change in the composition of the reactant gas species due to large change in the consumed area. The gas plasmas used are fluorine based such as CF$_4$, CHF$_3$, SF$_6$, and NF$_3$, or any combination thereof.

Continuing with FIG. 3, the first metal layer 41 is formed of titanium/aluminum (Ti/Al), or in combination with titanium-nitride TiN thusly, (Ti/TiN/Al). The preceding metal combinations could also be formed with silicon or copper in place of the aluminum. Titanium-nitride/tungsten (TiN/W) could also be used, as could many other metal combinations as is well known in the art. The metal layer 41 is formed to a thickness of between about 3,000 and 8,000 Angstroms and is deposited by sputtering, evaporation, or chemical vapor deposition. This metal layer is then patterned as required for device interconnection. The next dielectric layer 52 is blanket-deposited by plasma enhanced chemical vapor deposition (PECVD) over dielectric layer 51 and metal layer 41. This layer is a high-quality oxide formed to a thickness of between 5,000 and 10,1000 Angstroms. Repeating the process described above for the first level patterning, a mask is used to define this time via openings (22) in a photoresist film, and a dry-etch process is then used to open the via windows through the second level dielectric. At this second critical step, the preferred embodiment is comprised of opening the maximum number of via holes, where the dummy via holes are allowed to reach only the dummy metal areas below (25). As the etchant exposure area is maximized, the end-point detection signal becomes more pronounced and more robust.

The process described is continued for additional levels of metallization such as second level metal (42) shown in FIG. 3. The intervening dielectric surfaces such as 51, and 52 are subjected to chemical/mechanical polishing (CMP). In this process, as is well known in the art, the wafer shown in FIG. 1 is held and rotated against polishing surface, on which there is a polishing slurry containing abrasive material such as alumina or silica. At the same time, a chemical etchant may be introduced so that material is removed from the wafer by both chemical and mechanical means. Because of the built-in uniformity of the pattern on the surfaces as shown in FIG. 2, the common problem of pattern sensitivity in CMP is greatly reduced.

The various process steps disclosed above are illustrated in the flow-chart of FIG. 4. The process starts with step 101 where a semiconductor substrate is provided with devices such as MOS or bipolar devices. The local interconnect metal, such as polysilicon, is formed to have active and dummy metal regions (step 102). After depositing an oxide layer by employing conventional means, contact and dummy holes are opened in step 103 of FIG. 4. A first level metal is then deposited in step 104. Then, active and dummy metal regions are patterned in step 105 followed by step 106 wherein the via and dummy holes are opened in accordance with the methods of the present invention. A second metal layer is deposited in step 107, and the process is completed by depositing a passivation layer over the entire top surface of the substrate. The layer in step 108 is an insulating, protective layer that prevents mechanical and chemical damage during the subsequent steps of assembly and packaging of the integrated circuit chips.

While the invention has been particularly shown and described with reference to the preferred embodiments thereof, it will be understood by those skilled in the art that various changes in form and details may be made without departing from the spirit and scope of the invention. For instance, the same procedures described here for MOS fabrication are just as applicable to the fabrication of bipolar semiconductors.

What is claimed is:

1. A method for improving the end-point detection for contact hole etching in multilayer metallurgy of submicron IC devices comprising the steps of:

providing a semiconductor substrate having devices formed within its surface;

depositing interconnect metal onto said substrate surface;

patterning local interconnect regions and dummy regions on said substrate;

depositing oxide layer over said substrate and covering said interconnect metal under thereof;

etching contact holes and dummy holes through the thickness of said oxide layer; and depositing first level metal into contact and dummy holes.

2. The method of claim 1, wherein said devices have polysilicon gates.

3. The method of claim 1, wherein the local interconnect metal is patterned to have isolated metallized dummy regions.

4. The method of claim 3, wherein said interconnect and dummy regions are polysilicon.

5. The method of claim 1, wherein said dielectric oxide is deposited over said metal layer in a PECVD reactor.

6. The method of claim 5, wherein the thickness of said oxide layer is between about 5,000 to 10,000 Angstroms.

7. The method of claim 1, wherein said dielectric is patterned with contact holes and dummy holes over underlying contact regions and dummy regions, respectively.

8. The method of claim 1, wherein said dielectric is dry-etched to form contact openings.

9. The method of claim 8, wherein said contact openings are comprised of dummy openings and openings that are functional.

10. The method of claim 1, wherein first level metal is deposited onto the surface having contact and dummy holes.

11. The method of claim 10, wherein the thickness of said metal is in between about 3,000 to 8,000 Angstroms.

12. The method of claim 10, wherein said metal makes contact with silicon wherever contact holes have access to silicon.

13. The method of claim 10, wherein said metal makes contact with dummy metal through dummy holes that are positioned over dummy metal regions.

14. A method for improving the end-point detection for via hole etching in multilayer metallurgy of submicron IC devices comprising the steps of:

providing a semiconductor substrate having a first level of metallization on its surface;

depositing an oxide coating over said substrate surface;

etching via holes and dummy holes through the thickness of said oxide coating; and depositing second level metal into said via and dummy holes.

15. The method of claim 14, wherein said oxide is deposited over the first metal layer in a PECVD reactor.

16. The method of claim 15, wherein the thickness of said oxide is in between about 5,000 to 10,000 Angstroms.

17. The method of claim 14, wherein said dielectric is patterned with via holes and dummy holes over underlying via regions and dummy regions, respectively.

18. The method of claim 15, wherein said oxide is dry-etched to form via openings.

19. The method of claim 18, wherein said vias are comprised of functional vias and dummy vias.

20. The method of claim 14, wherein second metal is deposited onto the surface having the via openings.

21. The method of claim 14, wherein the first metal is patterned to have isolated metallized dummy regions.

22. The method of claim 20, wherein the second metal makes contact with the first metal wherever via holes have access to the first metal.

23. The method of claim 20, wherein said second metal makes contact with dummy metal wherever via holes have access to isolated metallized regions.

24. A method of forming an interconnecting metallization system comprising the steps of:

providing a semiconductor substrate having devices formed within its surface;

depositing interconnect metal layer onto said substrate surface;

forming active and dummy metal interconnect regions on said interconnect metal layer;

depositing first oxide layer covering said interconnect metal layer on said substrate surface;

forming contact holes and dummy contact holes through said first oxide layer, wherein said respective holes reach underlying said active and said dummy interconnect regions, respectively;

depositing first level metal;

forming active and dummy first metal regions on said first level metal;

depositing second oxide layer covering said first level metal on said substrate surface;

forming via holes and dummy via holes through said second oxide layer, wherein said respective holes reach underlying said active and said dummy first metal regions, respectively;

depositing second level metal; and depositing passivation layer.

* * * * *

UNITED STATES PATENT AND TRADEMARK OFFICE
CERTIFICATE OF CORRECTION

| | | |
|---|---|---|
| PATENT NO. | : 5,747,380 | Page 1 of 1 |
| APPLICATION NO. | : 08/606833 | |
| DATED | : May 5, 1998 | |
| INVENTOR(S) | : Yu et al. | |

It is certified that error appears in the above-identified patent and that said Letters Patent is hereby corrected as shown below:

In Col. 6, line 58, delete "said dielectric oxide" and insert --said oxide layer--.
In Col. 6, line 62, delete "said dielectric" and insert --said oxide layer--.
In Col. 6, line 65, delete "said dielectric" and insert --said oxide layer--.
In Col. 7, line 24, delete "said oxide" and insert --said oxide coating--.
In Col. 7, lines 26-27, delete "said oxide" and insert --said oxide coating--.
In Col. 7, line 28, delete "said dielectric" and insert --said oxide coating--.
In Col. 7, line 31, delete "said oxide" and insert --said oxide coating--.

Signed and Sealed this
Fourteenth Day of February, 2012

David J. Kappos
*Director of the United States Patent and Trademark Office*